(12) United States Patent
Kobayashi

(10) Patent No.: US 6,225,677 B1
(45) Date of Patent: May 1, 2001

(54) INDUCTANCE DEVICE FORMED ON SEMICONDUCTOR SUBSTRATE

(75) Inventor: Osamu Kobayashi, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/175,975

(22) Filed: Oct. 21, 1998

(30) Foreign Application Priority Data

Mar. 11, 1998 (JP) .................................................. 10-059620

(51) Int. Cl.[7] .............................. H01L 29/00; H01L 27/04
(52) U.S. Cl. ........................ 257/531; 257/528; 257/544
(58) Field of Search .................................. 257/531, 528, 257/544; 216/2

(56) References Cited

U.S. PATENT DOCUMENTS

| | | | |
|---|---|---|---|
| 5,070,317 | * 12/1991 | Bahgat | 336/200 |
| 5,488,299 | * 1/1996 | Kondo et al. | 24/318 |
| 5,663,570 | * 9/1997 | Reedy et al. | 257/9 |
| 5,705,963 | * 1/1998 | Ikeda et al. | 333/184 |

FOREIGN PATENT DOCUMENTS

| | | |
|---|---|---|
| 7-130962 | 5/1995 | (JP) . |
| 7-183468 | 7/1995 | (JP) . |
| 7-235640 | 9/1995 | (JP) . |

* cited by examiner

Primary Examiner—William Mintel
Assistant Examiner—Shouxiang Hu
(74) Attorney, Agent, or Firm—Armstrong, Westerman, Hattori, McLeland & Naughton

(57) ABSTRACT

According to a first aspect of the present invention, a plurality of PN junctions are formed at the surface of a semiconductor substrate under a belt-like conductive film having a spiral shape which constitutes an inductance device. A reverse bias voltage is applied to the PN junctions, and the surface of the substrate is completely depleted. Since the reverse bias voltage is applied to the PN junctions, even though the impurity density of the surface of the substrate is high and the adjacent PN junctions are separated to a degree, the extension of the depletion layers can be increased and complete depletion of the surface of the substrate can be achieved.

3 Claims, 6 Drawing Sheets

INDUCTANCE DEVICE FORMED ON SEMICONDUCTOR SUBSTRATE

BACKGROUND OF THE INVENTION

1. Field of the Invention

The present invention relates to an inductance device, formed on a semiconductor substrate, which constitutes an integrated circuit, and in particular to an inductance device for which there is a small loss and a small inductance reduction.

2. Related Arts

Recently there has been a reduction in the sizes of the portable communication devices, such as portable telephones. And this has been accompanied by an increased demand for the high-frequency circuits used in such small portable communication devices to be constituted using integrated circuits for which silicon semiconductors are employed. Such high-frequency circuits require not only transistors, resistors and capacitors, but also inductance devices, such as coils and transformers. Therefore, the inductance devices must be formed on a silicon substrate, with transistors and resistors being employed by integrated circuits.

The inductance device is generally provided by depositing an aluminum, belt-like spiral or coil shaped conductive film on an insulating film formed on the surface of a semiconductor substrate. However, with this structure, it is well known that since the semiconductor substrate is located very near the inductance device, an eddy current, which prevents a change in the magnetic flux generated when a current flows across the inductance device, is generated in the semiconductor substrate so that the characteristic of the inductance device has a loss.

Specifically, assuming that a belt-like conductive layer, which is deposited in the shape of a coil, serves as a primary coil for a transformer, the semiconductor substrate including impurities has a low resistance and thus serves as a short-circuited secondary coil in a high-frequency area. The loss caused due to the presence of the secondary coil is noticeable, particularly in a high-frequency area, and several methods for preventing the occurrence of an eddy current in the semiconductor substrate have been proposed. In Japanese Unexamined Patent Publication No. Hei 7-183468, for example, a method is described wherein a plurality of PN junctions are formed at the surface of a silicon semiconductor substrate, and the effect of an eddy current is limited by using depletion layers generated at the PN junctions. In other words, the passage of an eddy current across the surface of the semiconductor substrate is interdicted by a plurality of depletion layers, so that the eddy current can be reduced. Furthermore, in Japanese Unexamined Patent Publication No. Hei 7-235640 a method is proposed wherein a plurality of PN junctions are formed at the surface of a silicon semiconductor substrate and a controlled reverse bias voltage is applied to the PN junctions, and capacitors provided by depletion layers formed at the junctions are employed to form a composite LC circuit device. In this prior art, the occurrence of an eddy current is also inhibited by using the depletion layers which are formed at the surface of the substrate.

FIG. 6 is a diagram illustrating the structure of such a conventional inductance device. N-type impurity areas 14 are formed at the surface of a P-type semiconductor substrate 10, and a plurality of PN junctions are formed at the surface of the semiconductor substrate 10. An insulating film 12 is deposited on the surface of the semiconductor substrate 10, and a belt-like conductive film 16 having a spiral shape is formed thereon. One end 16A of the belt-like conductive film is connected to a line (not shown) and the other end 16B is connected to a lower line 18 formed in the insulating film 12. When a current flows from one end of the belt-like conductive film 16 to the other end in the direction indicated by an arrow 22, magnetic flux is induced in the spiral wiring.

Since depletion layers are formed at the PN junctions in the structure shown in FIG. 6, a greater number of depletion layers are formed at the obverse surface of the substrate 10, the resistance for the eddy current, generated in the semiconductor substrate 10 with respect to the magnetic flux, which is generated by the inductance device constituted by the belt-like conductive film 16, is increased, and the eddy current can be inhibited so that a loss due to the eddy current and a reduction of the inductance can be prevented.

In the above prior art, however, a plurality of depletion layers are merely formed at the surface of the semiconductor substrate 10, and an eddy current is still induced at the surface. That is, since an undepleted semiconductor area is present between the primary coil of the belt-like conductive film 16 and the secondary coil, which is the path taken by the eddy current in the substrate 10, the mutual inductance generated between the coils is not low. Although the entire surface of the semiconductor substrate could become depleted, the minute processing is automatically limited to form impurity containing areas 14 having a conductive type opposite to the substrate 10, at the surface of the substrate 10 on which an integrated circuit is mounted. Therefore, it is difficult to form a plurality of adjacent PN junctions which can adequately deplete the entire surface of the substrate 10. Furthermore, since the semiconductor substrate 10 on which the integrated circuit is mounted has itself a high impurity density, the width of the depletion layer that extends naturally between the PN junctions formed at the surface is not very great. As a result, at most a thin depletion layer is formed along the PN junctions. Therefore, the entire surface of the substrate 10 is not depleted, and as is described above, the prior art can provide an effect whereby only the resistance is reduced in an area where an eddy current occurs.

In addition, as is shown in an equivalent circuit in FIG. 7, the density of the impurities in the substrate 10 is comparatively high, and a resistance Rs inside the substrate 10 is comparatively low. A resistance $r_n$ in the N-type impurity areas 14 formed in the surface of the substrate 10 is also comparatively low. Thus, a capacitor provided by the PN junction and the insulating film 12 are electrically connected to an inductance device L, and affects its characteristic.

As is described above, since the inductance device, which is the belt-like conductive film 16, serves as the primary coil, and the path of the eddy current in the substrate 10 serves as a secondary coil, in order to reduce the loss incurred by the inductance device and to improve its characteristic, the strength of the insulation between the coils must be increased and the effective mutual inductance between the coils must be reduced.

Further, as is shown in FIG. 6, when a current 22 flows across the belt-like conductive film 16, an eddy current 20 is generated not only in the substrate 10 but also in the belt-like conductive film 16. Since many magnetic fluxes are generated, particularly at the belt-like conductive film 16 which is wound at an inward portion, a large eddy current 20 occurs. Since such eddy current in the conductive film 16 is also a factor in a loss, its occurrence should be avoided. To avoid the occurrence of an eddy current, the width of the wire of the belt-like conductive film 16 could be narrowed;

however, this is not feasible because in that case the resistance of the conductive film 16 would be increased, and the inductance element thereof also would be increased.

SUMMARY OF THE INVENTION

It is, therefore, one objective of the present invention to provide an inductance device having a structure in which the insulation disposed between a belt-like conductive film on the surface of a semiconductor device and the areas in a semiconductor substrate is improved to be large.

It is another objective of the present invention to provide an inductance device with which prevented is the occurrence of an eddy current in a belt-like conductive film formed on the surface of a semiconductor substrate.

To achieve the above objectives, according to a first aspect of the present invention, a plurality of PN junctions are formed at the surface of a semiconductor substrate under a belt-like conductive film having a spiral shape which constitutes an inductance device. A reverse bias voltage is applied to the PN junctions, and the surface of the substrate is completely depleted. Since the reverse bias voltage is applied to the PN junctions, even though the impurity density of the surface of the substrate is high and the adjacent PN junctions are separated to a degree, the extension of the depletion layers can be increased and complete depletion of the surface of the substrate can be achieved.

In addition, to achieve the above objectives, according to a second aspect of the present invention, a thick insulating area is formed by oxygen ion injection in the surface of a substrate under a belt-like conductive film in a spiral shape which constitutes an inductance device. The insulating area is thicker than the thin insulating film used for wiring which is formed on an ordinary integrated circuit device area. Because of the A thick insulating area, the substantial mutual inductance between the first coil, which is the inductance device, and the second coil, which is the path for an eddy current in the semiconductor substrate, can be reduced. In addition, since better insulation can be obtained than when the surface of the substrate is completely depleted using the PN junctions, the loss of the inductance device is small.

Furthermore, to achieve the above objectives, according to a third aspect, a slit extending in a direction of coil winding is formed in a belt-like conductive film having a coil shape, so that the belt-like conductive film is constructed by a plurality of parallel wires which extend in the direction of the coil winding. With this structure, the path of an eddy current generated in the belt-like conductive film can be removed, and the occurrence of the eddy current and the loss of the inductance can be reduced.

To achieve the above objectives, according to a fourth aspect, a belt-like conductive film formed in a coil shape is made of an anisotropic conductive material whose conductivity in the direction of the coil winding is higher than its conductivity in a direction perpendicular to that of the coil winding. When the belt-like conductive film is made, for example, of an oxide superconducting material or an organic conducting material, the conductivity in the direction of the coil winding will be high and the conductivity in the perpendicular direction will be low. When this material is employed for the belt-like conductive film, an increase in the resistance of the conductive film in the direction of the coil winding can be avoided and an internally occurred eddy current can be reduced.

DETAILED DESCRIPTION OF THE PREFERRED EMBODIMENTS

The preferred embodiments of the present invention will now be described. It should be noted, however, that the technical scope of the present invention is not limited to these embodiments.

Figure 1:
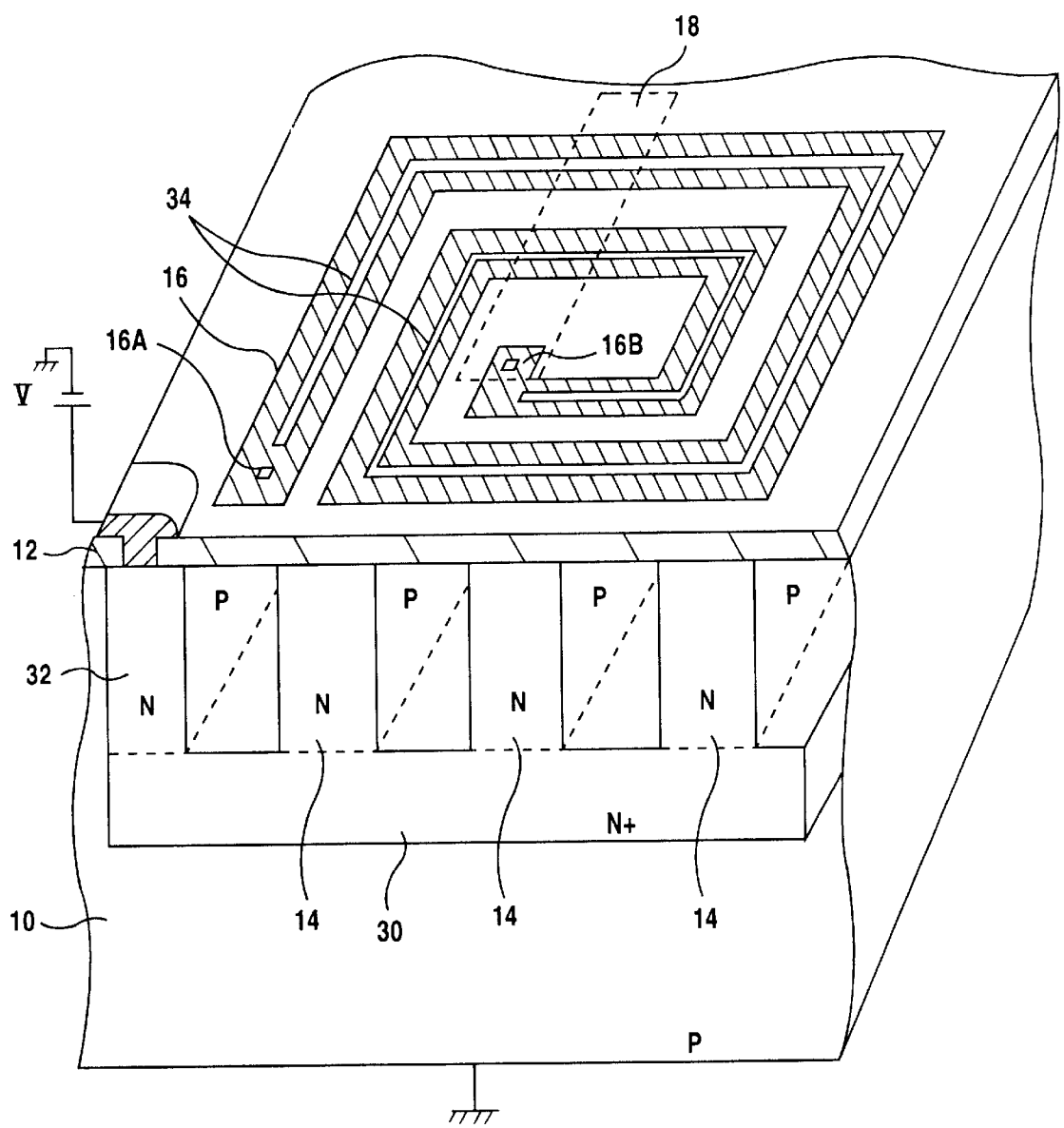
FIG. 1 is a diagram illustrating the structure of an inductance device according to one embodiment of the present invention.

FIG. 1 is a diagram illustrating the structure of an inductance device according to one embodiment of the present invention. In this embodiment, a plurality of N-type impurity areas 14 are formed in the surface of a P-type semiconductor substrate 10 so that a plurality of PN junctions are formed at the surface. In addition, an N-type embedded impurity area 30 having a higher impurity density is formed inside the semiconductor substrate 10. High energy ion injection, for example, can be employed to form the embedded impurity area 30. The embedded impurity area 30 is introduced to the surface of the substrate 10 through an N-type impurity area 32, which is formed at the same time as the N-type impurity areas 14.

A reverse bias voltage V is applied to the PN junctions between the P-type semiconductor substrate 10 and the N-type impurity areas 14. The reverse bias voltage V is such a level that the depletion layers extending outward from the PN junctions at the surface of the substrate 10 can be linked.

Figure 2:
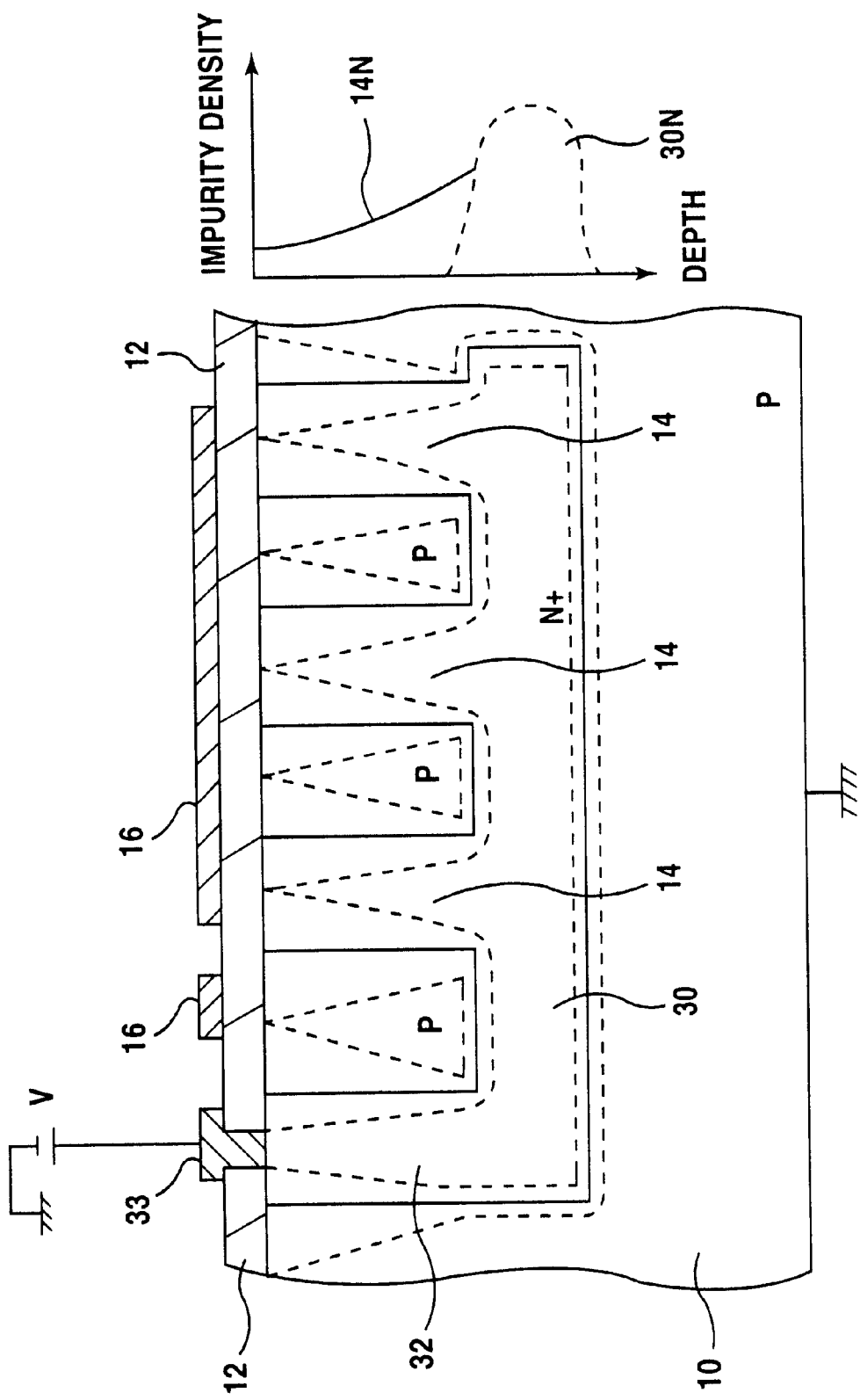
FIG. 2 is a detailed cross-sectional view of the inductance device in FIG. 1 upon the application of a reverse bias voltage.

FIG. 2 is a detailed cross-sectional view of the inductance device in FIG. 1 at the time of the application of the reverse bias voltage. As is apparent from the impurity density distributions shown on the right side in FIG. 2, an impurity density 14N of the N-type impurity area 14 is low at the surface of the substrate 10 and becomes progressively higher moving inward from the surface of the substrate 10, while an impurity density 30N of the embedded impurity area 30 is higher than that of the N-type impurity area 14.

The reverse bias voltage V, which is to be applied between the PN junctions at the surface of the substrate 10, is transmitted from a conductive layer 33 on the surface of the substrate 10, through an N-type impurity area 32 and the N-type embedded impurity area 30, and is applied to the N-type impurity areas 14 which form the PN junctions under the inductance device 16. Therefore, the depletion layers, which extend from the PN junctions, are spread as is indicated by the broken lines. That is, the extensions of the depletion layers close to the surface of the substrate 10 are large and the depletion layers which extend from the adjacent PN junctions are linked together, so that the surface of the substrate 10 is completely depleted. The extensions of the depletion layers, which extend from the PN junctions inside the substrate 10 having the high impurity density, are smaller than the extensions close to the surface of the substrate 10. Thus, the voltage applied from the embedded impurity area 30 inside the substrate 10 is effectively applied to the surface after passing through a perpendicular non-depleted area in the impurity areas 14 (an N-type semiconductor area), so that the complete depletion at the surface of the substrate 10 is ensured.

In the example of FIG. 1, a plurality of N type impurity areas 14 are formed, in plan view, in the surface of the P-type semiconductor substrate 10; however, the present invention is not limited to this arrangement; N impurity areas may be arranged in a lattice shape, or minute areas may be arranged in a matrix shape. So long as more PN junctions are terminated at the surface of the substrate 10, the entire surface of the substrate can be easily depleted by using depletion layers extending from the PN junctions.

In this embodiment, a belt-like and coil shaped conductive film 16, which constitutes the inductance device, is formed on an insulating film 12 covering the area where the PN junctions are formed. As is shown in FIG. 1, the belt-like conductive film 16 includes a slit 34 extending in the direction of the coil winding. Thus, the structure of the belt-like conductive film 16 is constituted by a plurality of wires connected in parallel and extended in the direction of the coil winding.

Since the slit 34 is formed in the belt-like conductive film 16, an eddy current generated in the belt-like conductive film 16 can be reduced, even when there is a current flowing between the ends 16A and 16B of the belt-like conductive film 16. The belt-like conductive film 16, which constitutes the inductance device, must have a specific width so that the film 16 does not include an inductance element. If the line width is too great for such purpose, however, many magnetic fluxes will pass through the coil, particularly its internal portion, and an associated eddy current will be generated in the belt-like conductive film 16. In this embodiment, therefore, the slit 34 is formed in the belt-like conductive film 16 to inhibit the occurrence of eddy currents. As a result, a route of an eddy current flow in the direction of the width of the belt-like conductive film 16 is removed, and accordingly, the generation of an eddy current can take place in only a small area. Even though the slit 34 is formed therein, since the belt-like conductive film 16 are connected parallely, the resistance in the direction of the coil winding will not be reduced.

It is also effective to form the slit 34 only in the internal coil portion of the belt-like conductive film 16. Since more magnetic fluxes penetrate the internal coil portion than the external coil portion, eddy currents can be inhibited effectively by forming the slit only in the internal coil portion of the belt-like conductive film 16.

Figure 3:
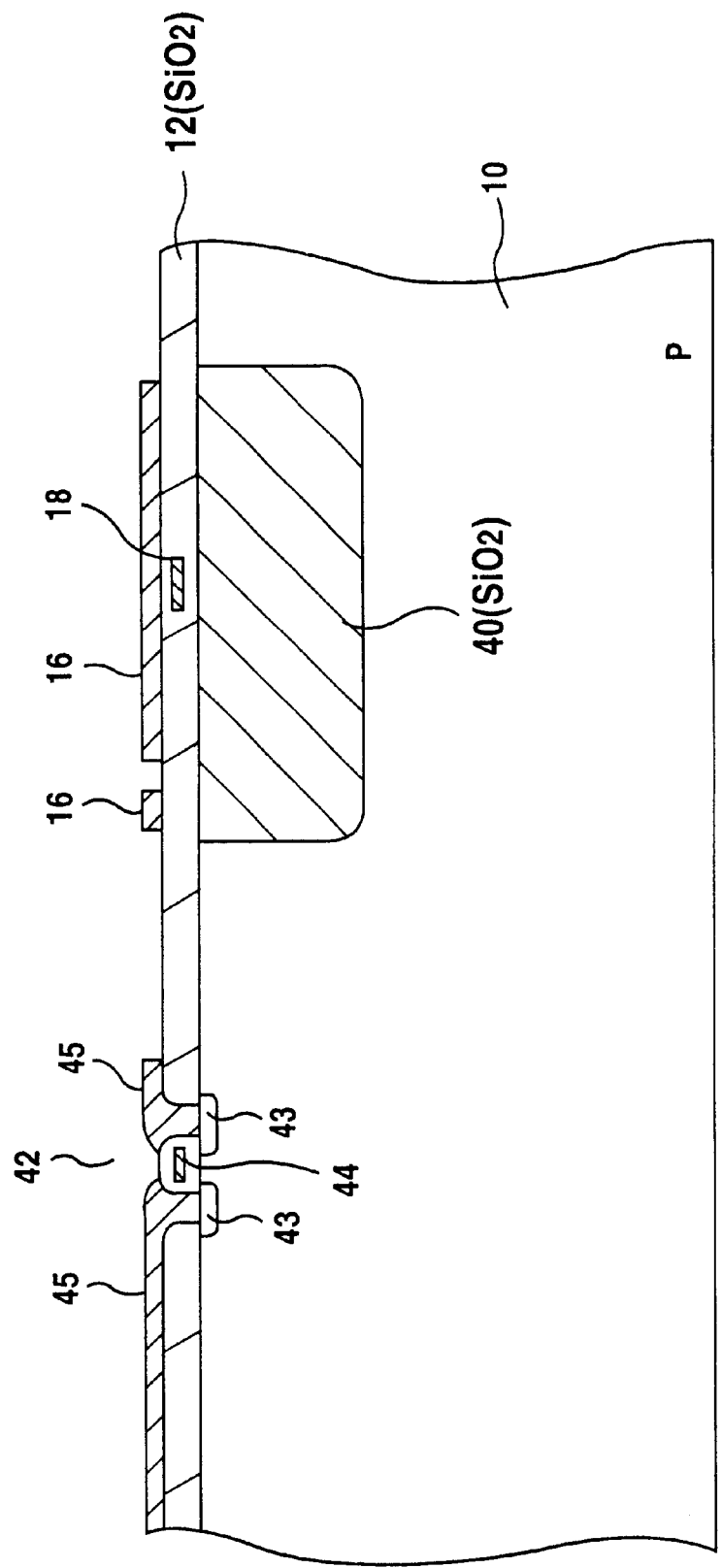
FIG. 3 is a cross-sectional view of an inductance device according to another embodiment of the present invention.

FIG. 3 is a cross-sectional view of an inductance device according to another embodiment of the present invention. In FIG. 3 are shown a belt-like conductive film 16 constituting an inductance device, and an MOS transistor 42 constituting an integrated circuit. The common MOS transistor 42 includes N-type source-drain areas 43 formed at the surface of a P-type substrate 10; a gate electrode 44 formed on a gate oxide film; and a wiring layer 45 introduced onto an insulating film 12 deposited on the surface of the substrate 10. The insulating film 12 is a silicon dioxide film formed, for example, using a CVD method, and its overall thickness is at most approximately 5000 Å.

Under the area whereat is formed the belt-like conductive film 16 constituting the inductance device, a thick insulating area 40 is formed which extends inward from the surface of the substrate 10. To form this insulating area 40, a simox method, a method which is used to form an SOI (Silicon On Insulator) structure on a semiconductor substrate, is employed. Specifically, according to the simox method, oxygen ions are injected into the surface of the substrate 10, so that a thick area extending inward from the surface of the semiconductor silicon substrate 10 can be changed to a silicon dioxide area 40. Therefore, the thickness of the insulating film 40 is, for example, equal to or greater than 1000 Å, and is considerably thicker than the wiring insulating film 12 on the common integrated circuit device.

As is described above, since not only the wiring insulating film 12 but also the thick insulating area 40, which extends inward from the surface of the substrate 10, is formed below the belt-like conductive film 16 constituting the inductance device, the belt-like conductive film 16 is completely insulated from the semiconductor area inside the substrate 10. Furthermore, the distance between the two can be extended, and the mutual inductance between the primary coil, provided by the belt-like conductive film 16, and the secondary coil, provided by an eddy current generated inside the substrate 10, can be reduced. In addition, the generation of an eddy current in the substrate 10 is also restricted.

Figure 4:
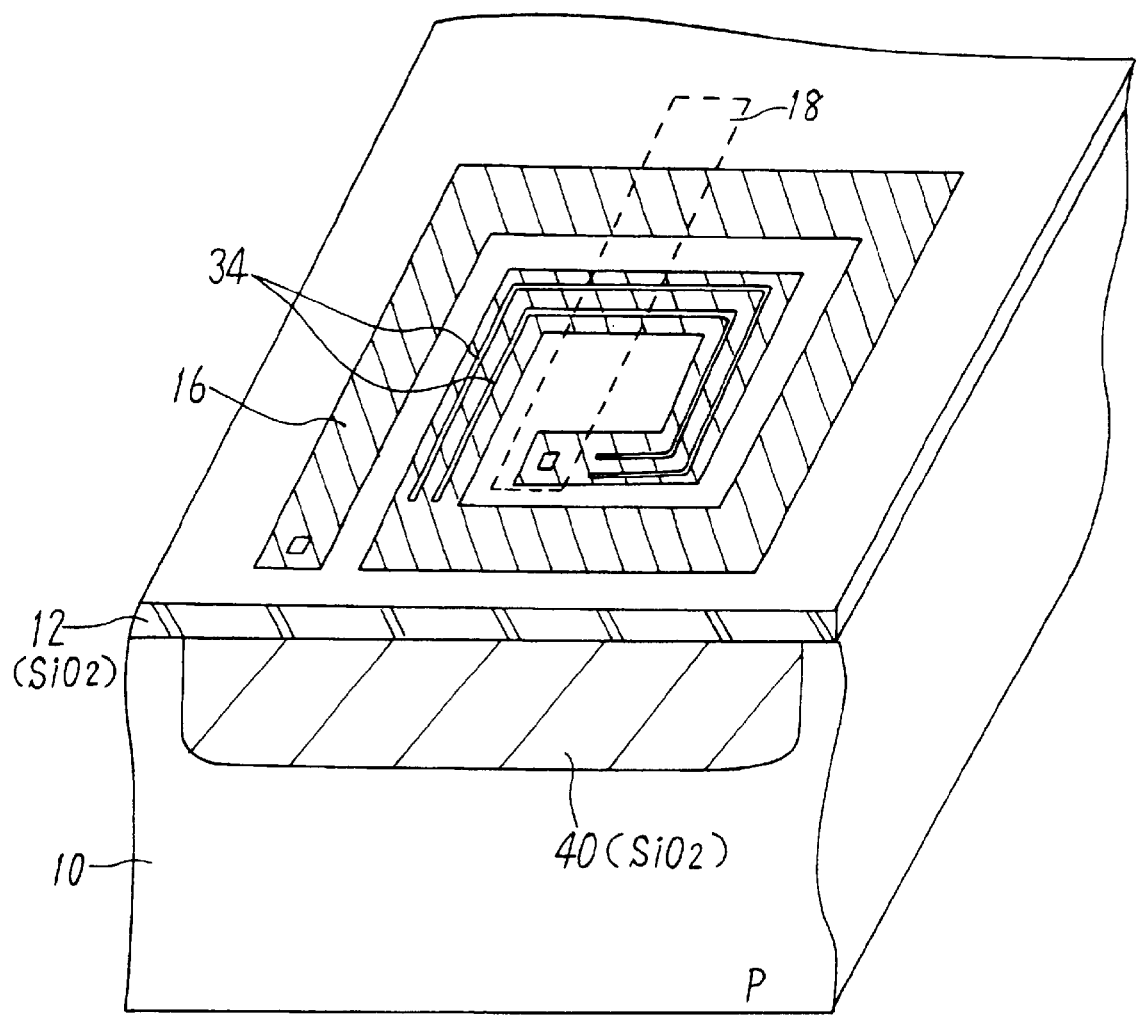
FIG. 4 is a partial cross-sectional perspective view of the inductance device shown in FIG. 3.

FIG. 4 is a partial cross-sectional perspective view of the inductance device in FIG. 3. As is shown in FIG. 4, the thick insulating area 40 is formed below the belt-like conductive film 16. Further, a plurality of slits 34 are formed in the internal portion of the coil shape of the belt-like conductive film 16. Since the slits 34 are formed in the internal portion of the coil wherein a high magnetic flux density is generated when a current flows across the belt-like conductive film 16, the generation of an eddy current in the belt-like conductive film 16 can be more efficiently reduced.

Figure 5:
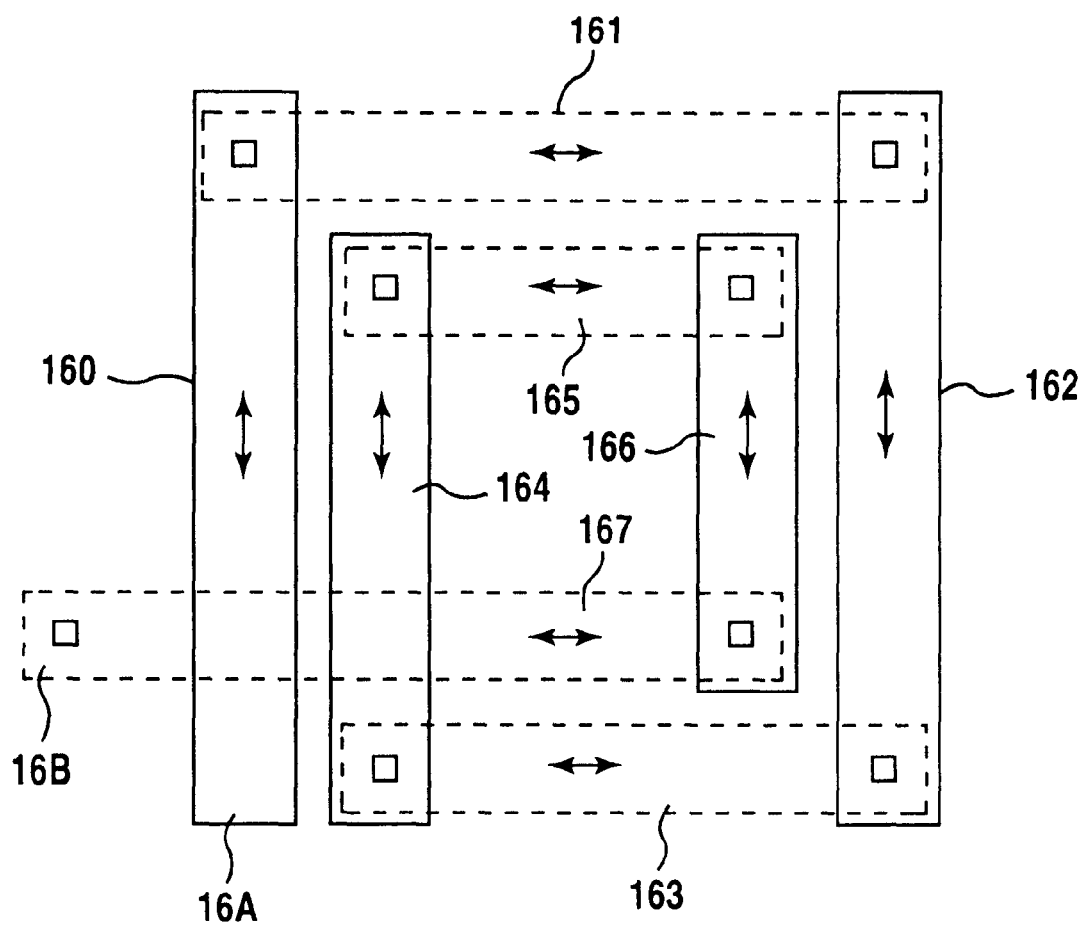
FIG. 5 is a plan view of the structure of another inductance device.
Figure 6:
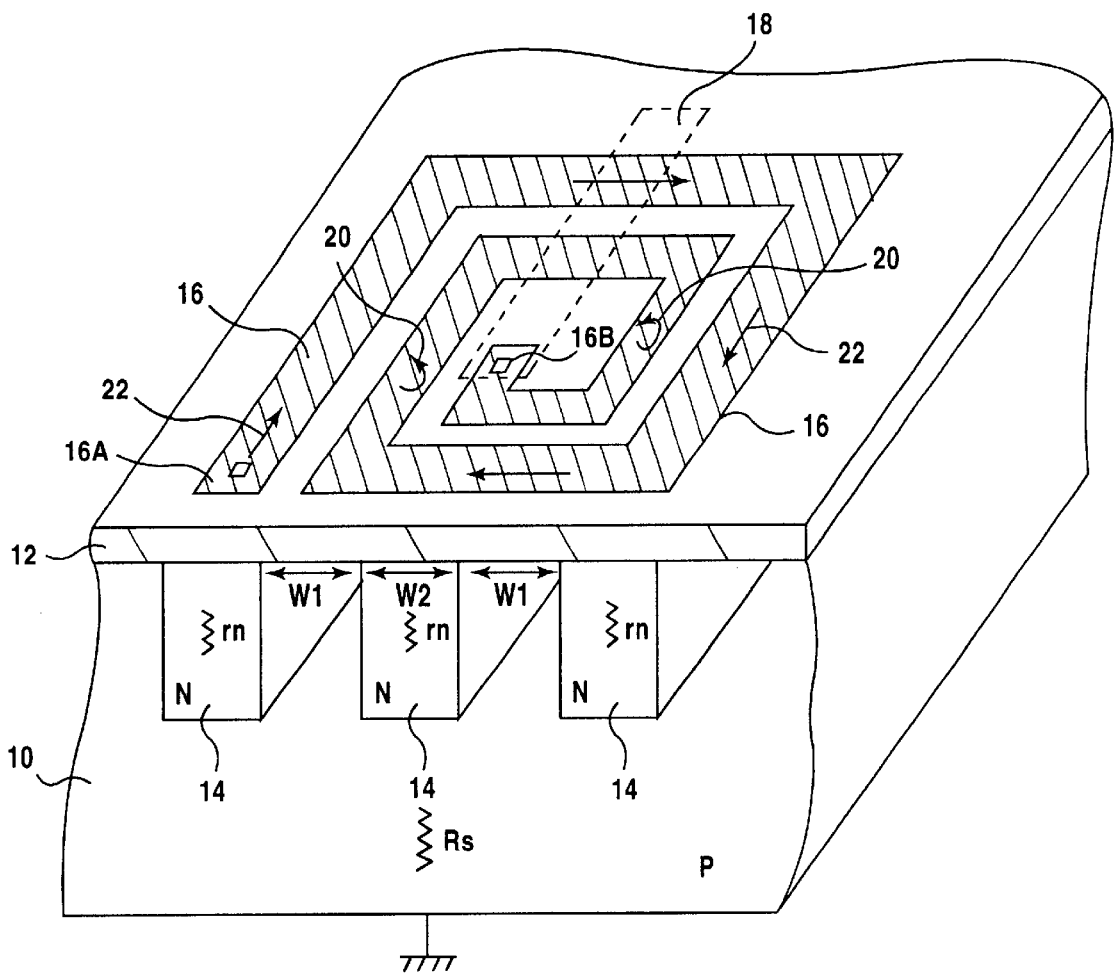
FIG. 6 is a diagram illustrating the structure of a conventional inductance device.
Figure 7:
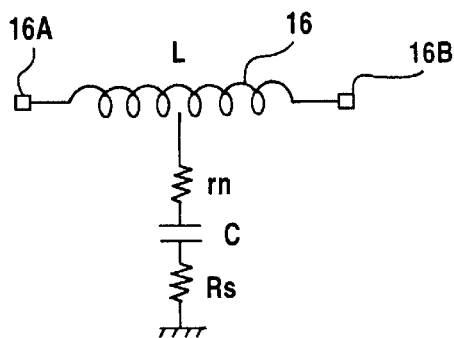
FIG. 7 is a diagram showing an equivalent circuit for FIG. 6.

FIG. 5 is a plan view of the structure of another example inductance device. In this example, a belt-like conductive film constituting the inductance device is made of a material having an anisotropic conductivity in which the conductivity in the direction of the coil winding is larger than the conductivity in the perpendicular direction, in order to reduce an eddy current which is generated in the belt-like conductive film. The material can be, for example, a ceramic oxide superconductive material such as $Y_2Ba_4Cu_7O_{15}$ or $LaBa_2Cu_3O_7$, or an organic conductive material such as polyacetylene. A thin film made of one of these materials is formed by sputtering or reactive evaporation, and is processed into a desirable shape by chemical etching or ion etching, so that its conductivity in a specific direction is greater than its conductivity perpendicular to the specific direction.

In the example in FIG. 5, the coil shape of the belt-like conductive film is constituted by horizontal lower layer wires 161, 163, 165 and 167 and vertical upper layer wires 160, 162, 164 and 166. By using the above method, first, an anisotropic conductive layer for lower layer wiring is formed and is etched into a pattern in the horizonal direction in FIG. 5 to form the lower layer wires 161, 163, 165 and 167. Then, an insulating layer is formed thereon and via holes are formed to connect between the upper and the lower layers. Furthermore, an anisotropic conductive layer for the upper layer wiring is formed, and is etched into a pattern in the vertical direction in FIG. 5 to form the upper layer wires 160, 162, 164 and 166. As a result, the coil shaped belt-like conductive film is provided which extends from one end 16A to the other end 16B.

The conductivity of the lower layer wires 161, 163, 165 and 167 in the direction of the coil winding indicated by arrows (horizontal direction) in FIG. 5 is higher than the conductivity perpendicular to that direction. Similarly, the conductivity of the upper layer wires 160, 162, 164 and 166 in the direction of the coil winding indicated by arrows (vertical direction) in FIG. 5 is higher than the conductivity perpendicular to that direction. Therefore, the belt-like conductive film of the inductance device in FIG. 5 can reduce an eddy current generated therein, without sacrificing the conductivity in the direction of the coil winding.

As is described above, according to the present invention, with respect to an inductance device formed on a semiconductor substrate, a plurality of PN junctions are formed at the surface of the substrate below a belt-like conductive film which constitutes the inductance device, and the reverse bias voltage is applied to the PN junctions to completely deplete the surface of the substrate. Therefore, an eddy current that is generated at the surface of the substrate can be reduced. Furthermore, the mutual inductance between the primary coil provided by the belt-like conductive film on the surface of the substrate and the secondary coil provided by an eddy current generated inside the substrate can be reduced. Thus, a loss in the characteristic of the inductance device can be reduced.

In addition, according to the present invention, since the thick insulating area is formed inside the substrate below the belt-like conductive film constituting the inductance device which is formed on the semiconductor device, an eddy current generated in the substrate can be reduced. Furthermore, the mutual inductance between the primary coil provided by the belt-like conductive film on the surface of the substrate and the secondary coil provided by an eddy current generated inside the substrate can be reduced. Thus, a loss in the characteristic of the inductance device can be reduced.

Further, according to the present invention, since a slit is formed in the belt-like conductive film constituting the inductance device which is formed on the semiconductor substrate, an eddy current generated in the belt-like conducive film can be reduced. Thus, a loss in the characteristic of the inductance device can be reduced.

Moreover, according to the present invention, since a material having an anisotropic conductivity in which the conductivity in the direction of the coil winding is larger than the conductivity in the perpendicular direction is employed for the belt-like conductive film constituting the inductance device which is formed on the semiconductor substrate, an eddy current generated in the belt-like conductive film can be reduced, and thus, a loss in the characteristic of the inductance device can be reduced.

What is claimed is:

1. An inductance device formed on a semiconductor substrate comprising:

a plurality of PN junctions formed at the surface of said semiconductor substrate; and a belt-like conductive film having a coil shape and constituting said inductance device, formed on an insulating film over an area in which said plurality of PN junctions are formed, wherein a reverse bias voltage is applied between said plurality of PN junctions, so that said area in said semiconductor substrate is completely depleted.

2. An inductance device according to claim 1, wherein said semiconductor substrate has one conductive type, first impurity regions having an opposite conductive type, whose impurity density progressively increases from the surface of the substrate toward an inside of the substrate, are formed at said surface of said substrate, so that said PN junctions are formed, and the reverse bias voltage applied to said first impurity areas is applied from an inside portion of said first impurity regions is applied from an inside portion of said first impurity regions in said substrate.

3. An inductance device according to claim 2, further comprising:

a second impurity region having said opposite conductive type, which is connected to said first impurity regions and is embedded in said substrate, wherein said reverse bias voltage is applied through said second impurity region.

\* \* \* \* \*